US012222282B2

(12) United States Patent
Jeong et al.

(10) Patent No.: US 12,222,282 B2
(45) Date of Patent: Feb. 11, 2025

(54) SEMICONDUCTOR MEASUREMENT APPARATUS

(71) Applicant: SAMSUNG ELECTRONICS CO., LTD., Suwon-si (KR)

(72) Inventors: Seoyeon Jeong, Suwon-si (KR); Seungwoo Lee, Suwon-si (KR); Inho Shin, Suwon-si (KR); Wookrae Kim, Suwon-si (KR); Myungjun Lee, Suwon-si (KR); Jaehwang Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 214 days.

(21) Appl. No.: 18/082,040

(22) Filed: Dec. 15, 2022

(65) Prior Publication Data
US 2023/0375463 A1 Nov. 23, 2023

(51) Int. Cl.
G01N 21/21 (2006.01)
G01B 11/24 (2006.01)
(Continued)

(52) U.S. Cl.
CPC ........ *G01N 21/211* (2013.01); *G01B 11/2441* (2013.01); *G01N 21/956* (2013.01); *G02B 27/283* (2013.01); *G01B 2210/56* (2013.01)

(58) Field of Classification Search
CPC .................. H01L 22/12; G02B 27/283; G01N 2021/8845; G01N 2021/8848;
(Continued)

(56) References Cited

U.S. PATENT DOCUMENTS 8,269,981 B1 9/2012 Doerband et al.
2004/0235205 A1 11/2004 Levy et al.
(Continued)

FOREIGN PATENT DOCUMENTS

EP 3845857 A1 7/2021
KR 10-2020-0018249 A 2/2020
(Continued)

OTHER PUBLICATIONS

Office Action dated Mar. 17, 2024 for corresponding application No. KR 10-2022-0061906.

Primary Examiner — Hina F Ayub
(74) Attorney, Agent, or Firm — Muir Patent Law, PLLC

(57) ABSTRACT

A semiconductor measurement apparatus includes an illumination unit configured to provide illumination light including linearly polarized light beams having different wavelengths, an optical unit including an objective lens configured to allow the illumination light to be incident on a sample, the optical unit being configured to transmit reflection light generated when the illumination light is reflected from the sample, a self-interference generator configured to self-interfere the reflection light transmitted from the optical unit and transmit the reflection light to a first image sensor, for each wavelength, and a controller. The controller is configured to process a measurement image output by the image sensor to divide the measurement image into a first image representing an intensity ratio of a polarization component of the reflection light and a second image representing a phase difference of the polarization component of the reflection light, for each wavelength.

20 Claims, 21 Drawing Sheets

(51) Int. Cl.
*G01N 21/956* (2006.01)
*G02B 27/28* (2006.01)

(58) Field of Classification Search
CPC ............. G01N 21/211; G01N 21/9501; G01N 21/956; G01B 11/2441; G01B 2210/56
See application file for complete search history.

(56) References Cited

U.S. PATENT DOCUMENTS

| | | |
|---|---|---|
| 2007/0247637 A1 | 10/2007 | de Groot |
| 2010/0134786 A1 | 6/2010 | De Lega et al. |
| 2013/0176531 A1 | 7/2013 | Ribak |
| 2015/0285735 A1 | 10/2015 | Wang et al. |
| 2015/0377799 A1 | 12/2015 | Barak et al. |
| 2017/0205342 A1 | 7/2017 | Krishnan et al. |
| 2021/0156790 A1* | 5/2021 | Hidaka .................... G01J 9/02 |
| 2022/0074848 A1 | 3/2022 | Jung et al. |

FOREIGN PATENT DOCUMENTS

| | | |
|---|---|---|
| KR | 10-2021-0048528 A | 5/2021 |
| KR | 10-2021-0065007 A | 6/2021 |
| KR | 10-2022-0032922 A | 3/2022 |

\* cited by examiner

SEMICONDUCTOR MEASUREMENT APPARATUS

CROSS-REFERENCE TO RELATED APPLICATION

This application claims benefit of priority to Korean Patent Application No. 10-2022-0061906 filed on May 20, 2022 in the Korean Intellectual Property Office, the disclosure of which is incorporated herein by reference in its entirety.

BACKGROUND

1. Field

One or more example embodiments relate to a semiconductor measurement apparatus.

2. Description of the Related Art

A semiconductor measurement apparatus may measure a critical dimension and the like of a structure in a sample including the structure formed in a semiconductor process using ellipsometry. In ellipsometry, inspection may be performed, and a critical dimension of a structure may be generally determined. The critical dimension may be included in a region of a sample to which illumination light having a short wavelength is irradiated. The critical dimension may be determined by irradiating the illumination light on the sample at a fixed azimuthal angle and incidence angle and using a spectral distribution of reflection light reflected from the sample. However, a spectrum of the reflection light includes only a spectral distribution caused by the illumination light having a short wavelength, and thus it is necessary to repeatedly perform measurement for each wavelength, so as to obtain a spectral distribution for each wavelength.

SUMMARY

Embodiments are directed to a semiconductor measurement apparatus capable of obtaining data necessary for determining a critical dimension at all azimuthal angles and in a wide range of incidence angle for each wavelength through image capturing performed once.

According to an aspect, there is provided a semiconductor measurement apparatus including an illumination unit configured to provide linearly polarized light beams having different wavelengths as illumination light, an optical unit including an objective lens configured to allow the illumination light to be incident on a sample, and a beam splitter configured to transmit reflection light generated when the illumination light is reflected from the sample, a self-interference generator configured to self-interfere and transmit the reflection light transmitted from the beam splitter, for each wavelength, an image sensor configured to output a measurement image including an interference pattern of the reflection light on a back focal plane of the objective lens, and a controller configured to process the measurement image to determine a critical dimension of a structure included in a region of the sample on which the illumination light is incident. The controller may be configured to find regions in which a peak caused by self-interference appears by transforming the measurement image into data in a two-dimensional frequency space, to obtain two-dimensional images divided for each wavelength on the back focal plane by inversely transforming data included in each of the regions, and to determine critical dimensions of the structure included in the sample using the two-dimensional images.

According to another aspect, there is provided a semiconductor measurement apparatus including an illumination unit configured to provide illumination light including linearly polarized light beams having different wavelengths, an optical unit including an objective lens configured to allow the illumination light to be incident on a sample, the optical unit being configured to transmit reflection light generated when the illumination light is reflected from the sample, a self-interference generator configured to self-interfere the reflection light transmitted from the optical unit and transmit the reflection light to a first image sensor, for each wavelength, and a controller configured to process a measurement image output by the image sensor to divide the measurement image into a first image representing an intensity ratio of a polarization component of the reflection light and a second image representing a phase difference of the polarization component of the reflection light, for each wavelength.

According to another aspect, there is provided a semiconductor measurement apparatus including an image sensor configured to divide reflection light, generated when illumination light including linearly polarized light beams having different wavelengths is reflected from a sample, into first and second polarization components in a polarization direction that are orthogonal to each other or have an arbitrary predetermined angle, for each wavelength, and output an interference pattern for self-interfering the first and second polarization components for each wavelength, and a controller configured to find regions in which a peak caused by self-interference appears by transforming the interference pattern output by the image sensor into data in a two-dimensional frequency space, obtain two-dimensional images divided for each wavelength by transforming data included in each of the regions, and obtain, from the two-dimensional images, a first image representing an intensity ratio of a polarization component of the reflection light reflected from the sample, and a second image representing a phase difference of the polarization component of the reflection light reflected from the sample, for each wavelength.

According to example embodiments, critical dimensions of a structure included in a sample may be measured by irradiating illumination light including linearly polarized light having different wavelengths to the sample, obtaining, from a measurement image captured by self-interfering reflection light reflected from the sample for each wavelength, a first image representing an intensity difference of a polarization component and a second image representing a phase difference of the polarization component, and using the first image and the second image.

Various and beneficial advantages and effects of example embodiments are not limited to the above description and will be more easily understood in the course of describing specific example embodiments.

BRIEF DESCRIPTION OF DRAWINGS

Features will become apparent to those of skill in the art by describing in detail exemplary embodiments with reference to the attached drawings in which.

DETAILED DESCRIPTION

Figure 1:
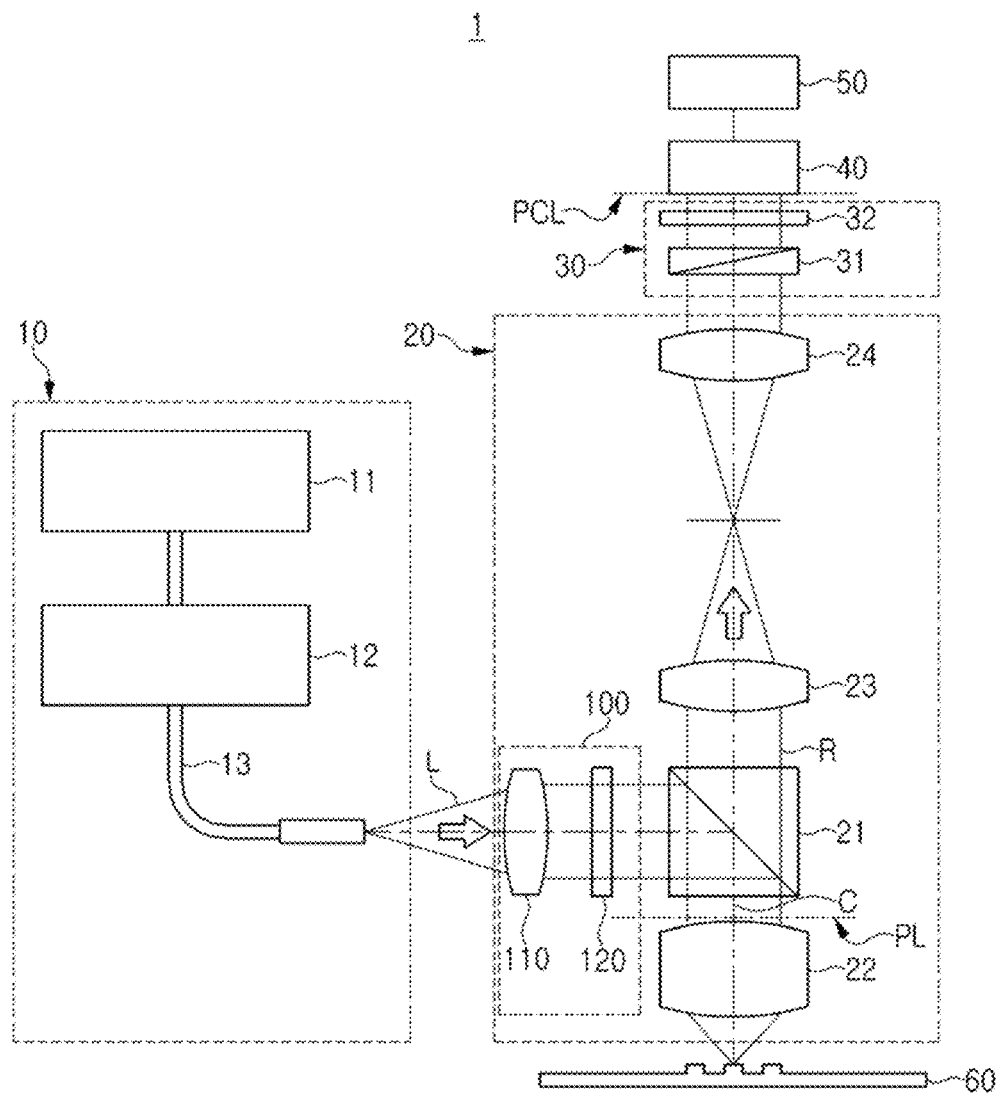
FIG. 1 is a schematic diagram illustrating a semiconductor measurement apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A semiconductor measurement apparatus according to an example embodiment will be described with reference to FIG. 1. FIG. 1 is a schematic diagram illustrating a semiconductor measurement apparatus according to an example embodiment.

Referring to FIG. 1, a semiconductor measurement apparatus 1 according to an example embodiment may be an apparatus that uses ellipsometry for measurement. As illustrated in FIG. 1, the semiconductor measurement apparatus 1 may include an illumination unit 10, an optical unit 20, a self-interference generator 30, an image sensor 40, a controller 50, and the like. The semiconductor measurement apparatus 1 may receive reflection light R generated when illumination light L having multiple wavelengths is irradiated onto a sample 60 by the illumination unit 10 and is reflected from the sample 60 to generate a measurement image. The semiconductor measurement apparatus 1 may analyze the measurement image to inspect a structure included in the sample 60 or to measure a critical dimension of the structure. The inspection of the structure may be understood as a process of determining whether the structure is present, changed, or contaminated.

Figure 2A:
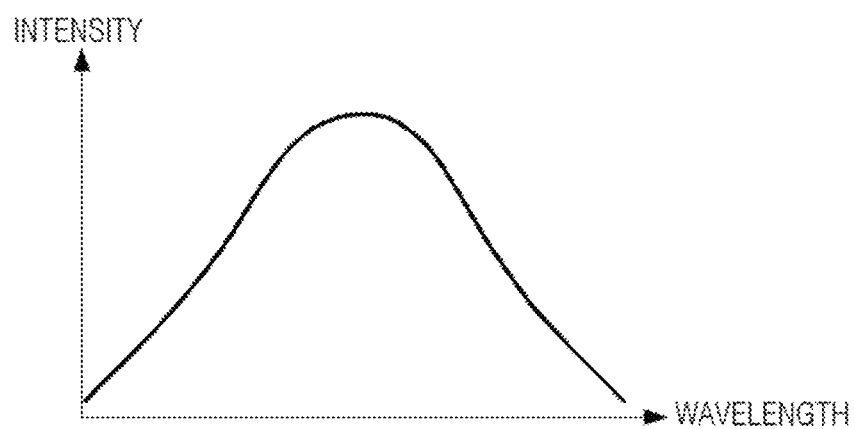
FIG. 2A is a diagram illustrating a spectrum of light output from a light source included in the illumination unit of FIG. 1.

The illumination unit 10 may include a light source 11, a wavelength selector 12, a fiber 13, and the like. The light source 11 may output light for generating the illumination light L incident onto the sample 60. For example, as illustrated in FIG. 2A, the light source 11 may include a continuous wavelength of a broadband including from an ultraviolet wavelength band to an infrared wavelength band. In some example embodiments, in the illumination unit 10, the wavelength selector 12 may be omitted, and the light source 11 may output as monochromatic light beams having a specific wavelength. In an example embodiment, a case in which the light source 11 includes the continuous wavelength of the broadband will be described as an example.

Figure 2B:
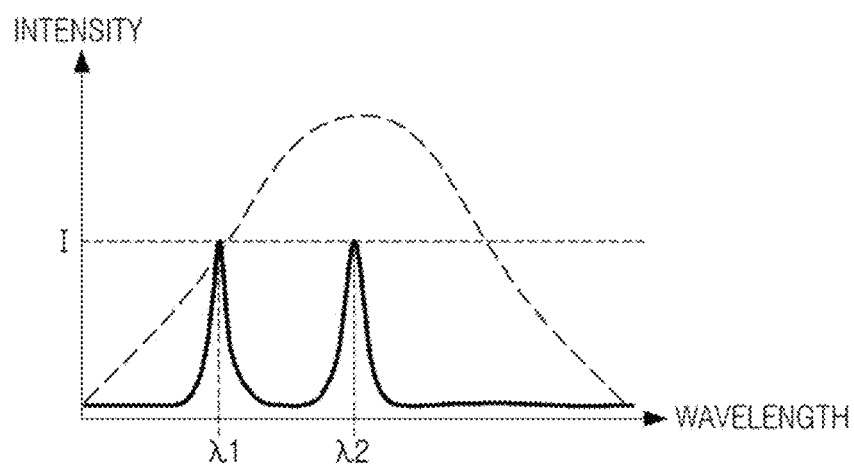
FIG. 2B is a diagram illustrating a spectrum of light output from a wavelength selector included in the illumination unit of FIG. 1.

The wavelength selector 12 may select and output at least two wavelengths from light emitted by the light source 11. When the light source 11 outputs light having specific wavelengths, the wavelength selector 12 may be omitted. As illustrated in FIG. 2B, for example, the wavelength selector 12 may select two wavelengths $\lambda 1$ and $\lambda 2$. In some example embodiments, the wavelength selector 12 may perform output after adjusting light having the selected wavelengths $\lambda 1$ and $\lambda 2$ to have substantially the same intensity I. Each of the wavelengths $\lambda 1$ and $\lambda 2$ selected by the wavelength selector 12 may include one wavelength, but may have a Gaussian distribution including adjacent wavelength bands in some example embodiments. The wavelength selector 12 may selectively output light having at least two wavelengths with highest sensitivity with respect to the critical dimension of the sample 60.

The wavelength selector 12 may be controlled by the controller 50. The wavelength selector 12 may select at least two wavelengths according to the control of the controller 50. In the controller 50, a database simulating a change rate of reflection light according to a change in critical dimension of the sample 60 may be pre-stored. The controller 50 may select, based on the pre-stored database, light having at least two wavelengths with highest sensitivity with respect to critical dimension of the sample 60, and may control the wavelength selector 12 to select light having the selected wavelengths and output the light as illumination light L. Accordingly, in embodiments in which the structure of the sample 60 have fine dimensions, it is possible to accurately determine only a critical dimension to be measured regardless of an interaction of critical dimensions affecting each other. For example, the wavelength selector 12 may include at least one of an acousto-optic modulator, a diffraction grating, and a band-pass filter.

The fiber 13 may be a cable-shaped light guide member, and light incident on the fiber 13 may be provided from the illumination lens 110 to the optical unit 20.

The optical unit 20 may include a polarization generator 100, a first beam splitter 21, an objective lens 22, a first relay lens 23, a second relay lens 24, and the like.

The polarization generator 100 may include an illumination lens 110 and a polarizer 120. The polarization generator 100 may convert the illumination light L provided to the fiber 13 into polarized light having a specific polarization component.

The illumination lens 110 may be a convex lens, and the light may be incident on the polarizer 120 by adjusting an angular distribution of the illumination light L irradiated by the fiber 13. For example, the illumination lens 110 may convert the illumination light L, irradiated by the fiber 13, into parallel light.

The polarizer 120 may convert the illumination light L, passing through the illumination lens 110 in a predetermined polarization direction, to be incident on the sample 60. In an example embodiment, the polarizer 120 may polarize the illumination light L in a polarization direction, inclined by 45 degrees with respect to a ground, and the illumination light L passing through the polarizer 120 may propagate to the first beam splitter 21 of the optical unit 20.

The first beam splitter 21 may reflect a first portion of the illumination light L received from the polarizer 120, and may transmit a second portion of the received illumination light L. The first portion of the illumination light L, reflected from the first beam splitter 21, may be incident on the objective lens 22. The first portion of the illumination light L, passing through the objective lens 22, may be incident on the sample 60. For example, the first portion of the illumination light L, passing through the objective lens 22, may be incident to focus on a target region of the sample 60.

When the first portion of the light passing through the objective lens 22 is reflected from the target region of the sample 60, the objective lens 22 may receive reflection light R, that is reflected again. In an example embodiment, an optical axis C of each of the first portion of the illumination light L incident on the sample 60 and the reflection light R reflected from the sample 60 may be perpendicular to a surface of the sample 60. The objective lens 22 may include a front surface, facing the sample 60, and a rear surface, positioned opposite the sample 60. A back focal plane may be defined at a pupil position PL of the objective lens 22.

The first portion of the illumination light L, irradiated onto the sample 60, may include light that is linearly polarized in a specific direction. The linearly polarized light included in the illumination light L may have wavelengths corresponding to the wavelengths selected by the wavelength selector 12, and may be condensed by the objective lens 22 to be incident on the target region of the sample 60. The illumination light L may include a P-polarized light component and an S-polarized light component according to an incidence angle determined with respect to the surface of the sample 60.

The reflection light R, reflected from the sample 60, may sequentially pass through the objective lens 22, the first beam splitter 21, and relay lenses 23 and 24. A first relay lens 23 may condense the reflection light R, passing through the first beam splitter 21, to form an image, and may then allow the reflection light R to be incident on a second relay lens 24. The reflection light R, passing through the second relay lens 24, may be incident on the self-interference generator 30.

Figure 3:
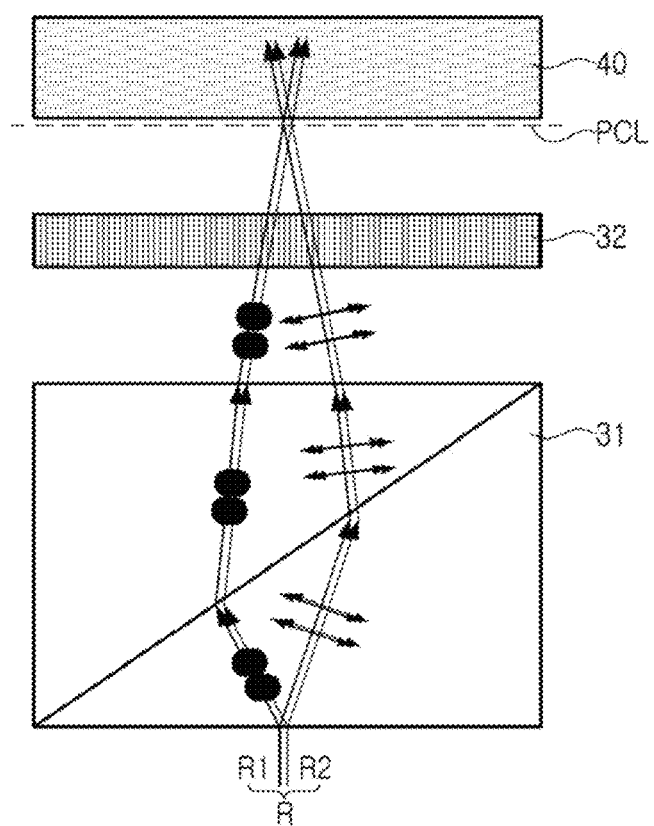
FIGS. 3 and 4 are diagrams illustrating a measurement method performed by the semiconductor measurement apparatus of FIG. 1.

The self-interference generator 30 may include a prism member 31, a polarization element 32, and the like. The prism member 31 may divide the reflection light R, passing through the optical unit 20, into light beams linearly polarized in two directions, for each wavelength. FIG. 3 illustrates how the prism member 31 may divide, again, linearly polarized light beams R1 and R2 included in the reflection light R into two linearly polarized light beams for each wavelength. The self-interference generator 30 may divide the linearly polarized light R1 and R2 included in the reflection light R into two linearly polarized light beams, for each wavelength, through the prism member 31, and then may merge the light beams again and provide the merged light beams to the image sensor 40. The linearly polarized light R1 and R2 included in the reflection light R may be divided through the prism member 31, and then may be merged again to interfere with each other, thereby forming an interference pattern on the back focal plane of the objective lens 22. Linearly polarized light beams having different wavelengths may not interfere with each other, and thus an interference pattern may be generated for each wavelength included in the reflection light R. For example, the prism member 31 may be implemented as at least one of a Nomarski prism, a Wollaston prism, or a Rochon prism having a property of birefringence. Polarization directions of the light beams linearly polarized in the two directions, generated by the prism member 31, may be defined as a first direction and a second direction, perpendicular to each other, respectively.

The polarization element 32 may transmit light polarized in a direction, inclined by 45 degrees from the first and second directions perpendicular to each other, among the reflection light R. In other words, the polarization element 32 may allow a polarization component of the reflection light R to pass therethrough in a direction, inclined by 45 degrees from the first direction, and may allow a polarization component of the reflection light R to pass therethrough in a direction, inclined by 45 degrees from the second direction. The reflection light R, passing through the polarization element 32, may be incident on the image sensor 40.

The image sensor 40 may output a measurement image using the received reflection light R. The measurement image, output by the image sensor 40, may be an image including an interference pattern of the reflection light R passing through the polarization element 32. The output image may include an interference pattern for each wavelength. The image sensor 40 may output the measurement image to the controller 50, and the controller 50 may process the measurement image to determine a critical dimension of a structure included in a region of the sample 60 onto which the illumination light L is irradiated.

The image sensor 40 may be disposed on a pupil plane disposed at a pupil conjugate position PCL, a conjugate with a pupil position PL of the objective lens 22, such that an image may be accurately formed on a surface of the image sensor 40. Hereinafter, an image formed on the back focal plane will be described in more detail with reference to FIG. 4.

Figure 4:
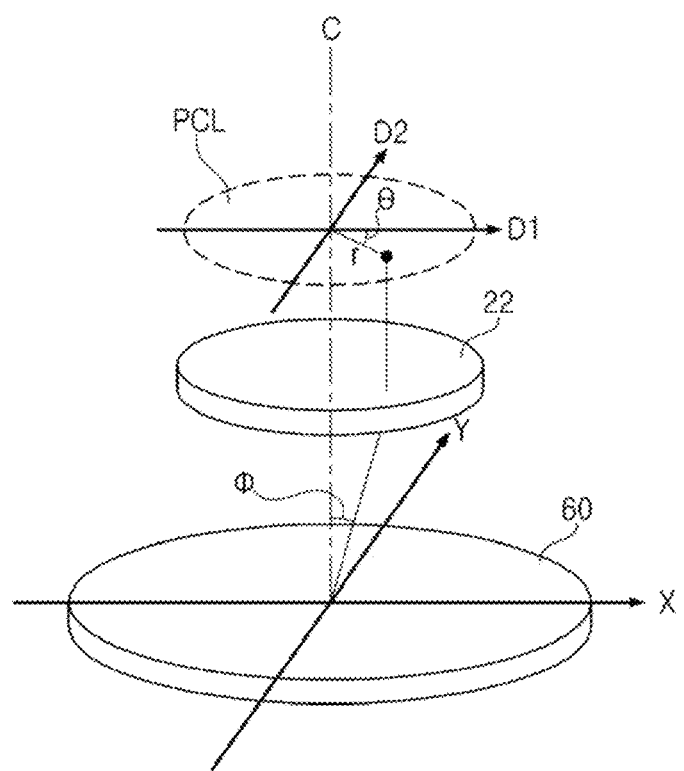

FIG. 4 is a diagram illustrating a measurement method performed by the semiconductor measurement apparatus of FIG. 1.

Referring to FIG. 4, the illumination light L may be irradiated onto a surface of the sample 60, and the surface of the sample 60 may be defined as an X-Y plane. The optical axis C may extend from an origin of the X-Y plane and may extend in a direction, perpendicular to the X-Y plane. The optical axis C may pass through a central portion of the objective lens 22, adjacent to the sample 60. The objective lens 22 may have a front surface, facing the sample 60, and a rear surface, positioned to oppose the sample 60, and a back focal plane may be defined as being a plane located at a predetermined distance from the rear surface of the objective lens 22.

The back focal plane may be a plane defined by a first direction D1 and a second direction D2. For example, the first direction D1 may be the same as the X-axis direction of the surface of the sample 60, and the second direction D2 may be the same as the Y-axis direction of the surface of the sample 60. The illumination light L, passing through the objective lens 22, may be condensed on a target region of the sample 60 in the form of a dot, and may be reflected from the target region again. The illumination light L may then pass through the objective lens 22 and propagate to the back focal plane. In the semiconductor measurement apparatus according to an example embodiment, light may be allowed to be incident on the sample 60 at all azimuth angles including 0 degrees to 360 degrees, and a range of an incidence angle φ of the illumination light L incident on the sample 60 may be determined according to a numerical aperture (NA) of the objective lens 22.

In an example embodiment, an objective lens 22 having a numerical aperture of 0 or more and less than 0.95 may be employed in the semiconductor measurement apparatus, such that data on a wide range of incidence angle may be obtained through a single image capture. In this case, a maximum incidence angle of light passing through the objective lens may be greater than or equal to 65 degrees and may be less than 90 degrees. When respective coordinates included in the back focal plane defined in the first direction D1 and the second direction D2 are represented as polar coordinates r and θ, a first coordinate r may be determined by an incidence angle φ, as illustrated in FIG. 4. A second coordinate θ may a value representing a degree of a coordinate being rotated with respect to the first direction D1, and thus, may be the same as an azimuthal angle of light incident on the sample 60, and may have a value of 0 degrees to 360 degrees.

In the semiconductor measurement apparatus according to an example embodiment, by performing a single image capture while light is reflected from a target region of the sample 60, data including an azimuthal angle of 0 degrees to 360 degrees and an interference pattern in a range of incidence angle determined according to the numerical aperture of the objective lens 22 may be obtained in an image format. In addition, light, passing through the objective lens 22, may be condensed and irradiated to the surface of the sample 60 to have a shape similar to a point shape. This is in contrast to a method of irradiating light to the surface of the sample 60 in an inclined direction according to the related art. In this way, an image of an arrangement state of patterns included in the target region of the sample 60 may be captured with high resolution. As a result, the semiconductor measurement apparatus according to an example embodiment may accurately calculate a critical dimension of a structure included in the sample 60.

The controller 50 may process a measurement image, output from the image sensor 40, to determine a critical dimension of a structure included in a region of the sample 60 onto which the illumination light L is irradiated. The controller 50 may control an overall operation of the semiconductor measurement apparatus 1. For example, the controller 50 may be implemented as a processor such as a central processing unit (CPU), a graphics processing unit (GPU), a microprocessor, an application specific integrated circuit (ASIC), a field programmable gate arrays (FPGA), and the like, and may be implemented as a general personal computer (PC). The controller 50 may include a memory for storing various pieces of data necessary for the operation of the semiconductor measurement apparatus 1. A database, simulating a change rate of reflection light according to a change in the critical dimension of the sample 60, may be pre-stored in the memory.

For example, the controller 50 may transform a measurement image into a frequency space, and may select a region in which a peak caused by interference appears, for each wavelength. In addition, the controller 50 may inversely transform data included in the selected region to divide the data into a pair of two-dimensional images for each wavelength. A Fourier transform, a Hilbert transform, and/or the like may be applied to a transform and an inverse transform. The pair of two-dimensional images may be a first image and a second image. The first image may be an image representing an intensity according to polarization of the reflection light R reflected from the sample 60, and the second image may be an image representing a phase difference according to polarization of the reflection light R reflected from the sample 60. For example, when the illumination light L includes a first wavelength λ1 and a second wavelength λ2, the reflection light R may include linearly polarized light having the first wavelength λ1 and linearly polarized light having the second wavelength λ2. The measurement image may include both a first image and a second image of the first wavelength λ1 and a first image and a second image of the second wavelength λ2. The first image may correspond to a first parameter Ψ of ellipsometry according to an azimuthal angle and an incidence angle, and the second image may correspond to a second parameter Δ of ellipsometry according to an azimuthal angle and an incidence angle. The controller 50 may calculate, from the first image and the second image divided for each wavelength, the first parameter Ψ and the second parameter Δ of ellipsometry for each wavelength.

By using the method described above, the semiconductor measurement apparatus 1 according to an example embodiment may irradiate the illumination light L having an optical axis C perpendicular to the surface of the sample 60, and including different wavelengths, and may determine the critical dimension of the structure included in the sample 60 by receiving the reflection light R, as described above with reference to FIG. 1. Accordingly, data corresponding to all azimuthal angles from 0 degrees to 360 degrees for each wavelength may be obtained through a single image capture. Data, corresponding to a wide range of incidence angles according to the numerical aperture of the objective lens, may also be obtained through a single image capture. In addition, the first parameter Ψ and the second parameter Δ of ellipsometry may be calculated for each wavelength through a single image capture, thereby improving the efficiency of a process using a semiconductor measurement apparatus.

A process in which the controller 50 calculates, based on a measurement image, the first parameter Ψ and the second parameter Δ of ellipsometry for each wavelength will be described with reference to FIGS. 6 to 11C.

Figure 6:
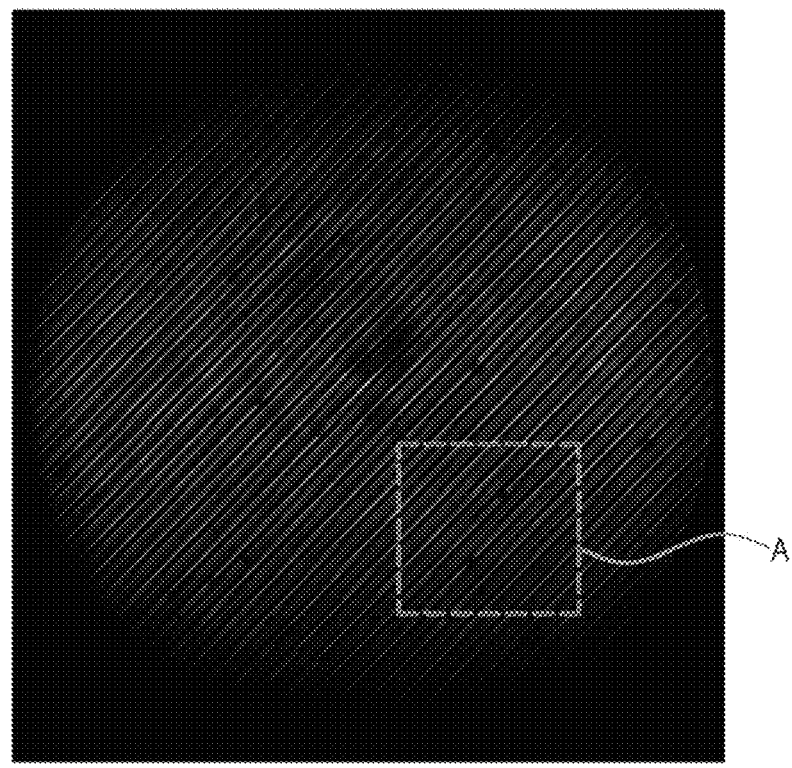
FIG. 6 is a diagram illustrating a measurement image obtained by a semiconductor measurement apparatus according to an example embodiment.
Figure 6:
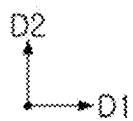
Figure 7A:
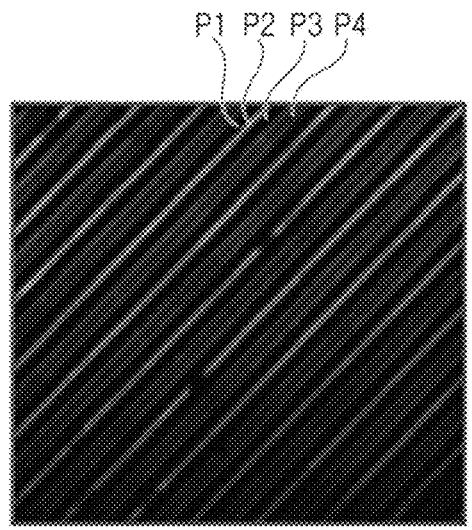
FIG. 7A is an enlarged view of part A of FIG. 6.
Figure 7B:
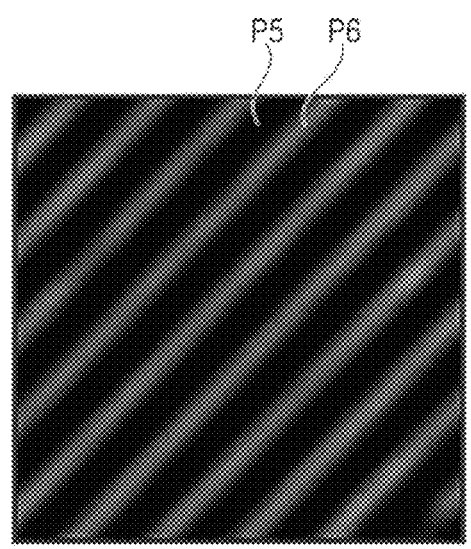
FIGS. 7B and 7C are diagrams of a comparative example with respect to part A of FIG. 6.
Figure 7C:
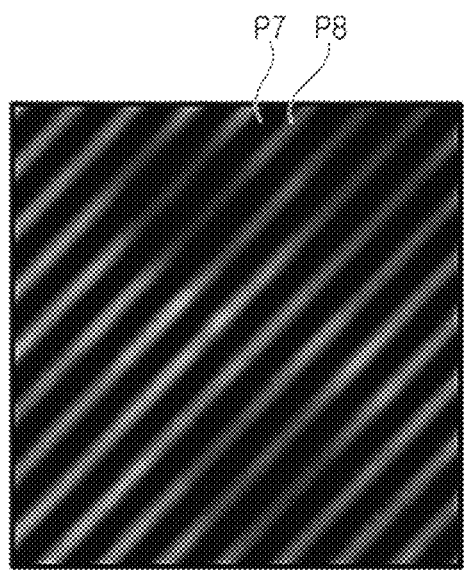
Figure 8:
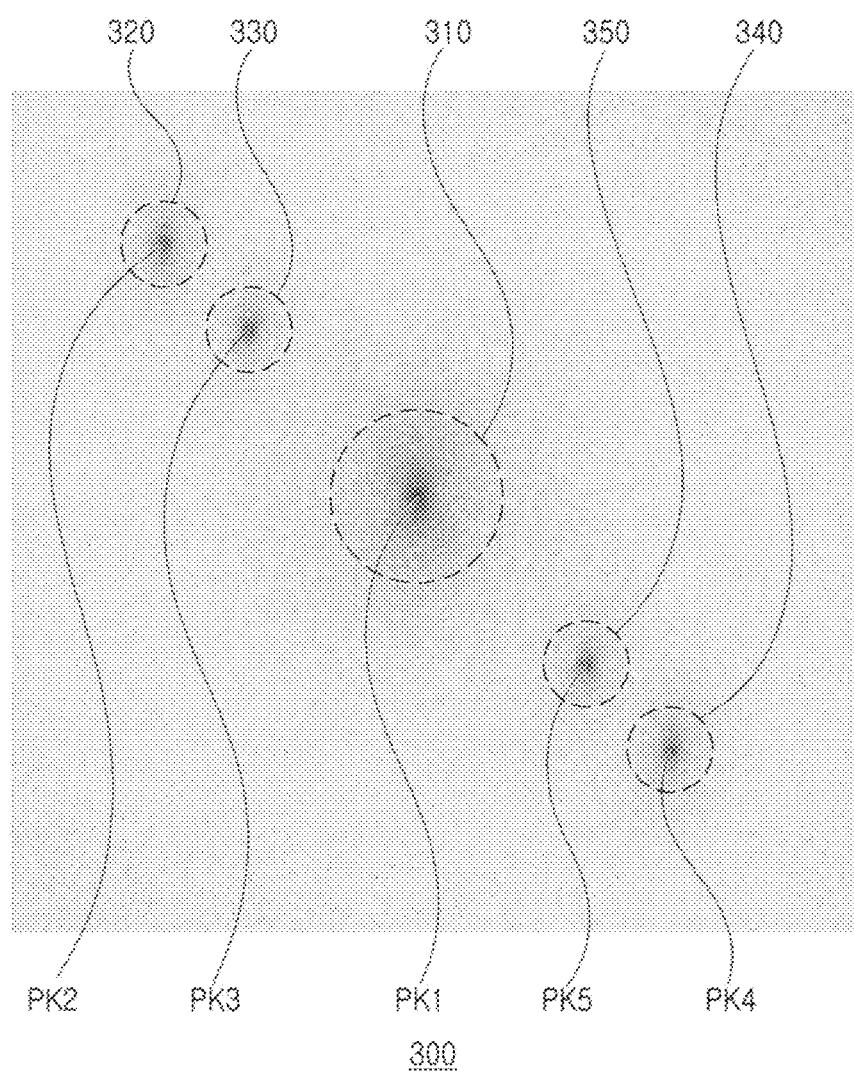
FIG. 8 is a diagram illustrating an image obtained by transforming the measurement image of FIG. 6 into a frequency space.
Figure 9A:
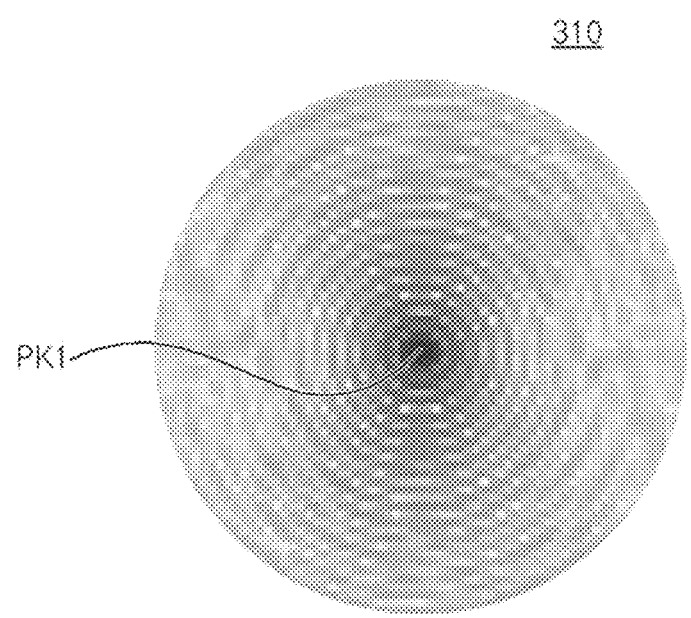
FIGS. 9A to 9C are enlarged views of respective regions selected among regions in which a peak appears in FIG. 8.
Figure 9B:
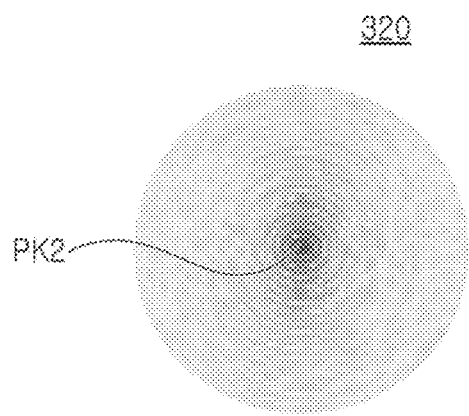
Figure 9C:
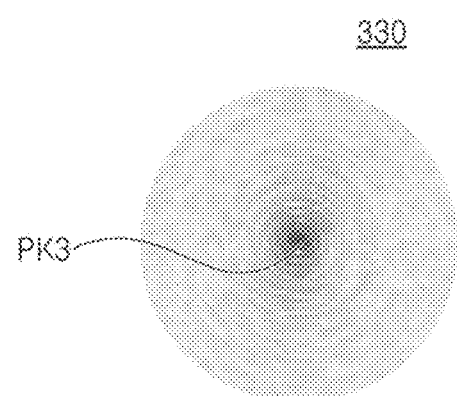
Figure 10A:
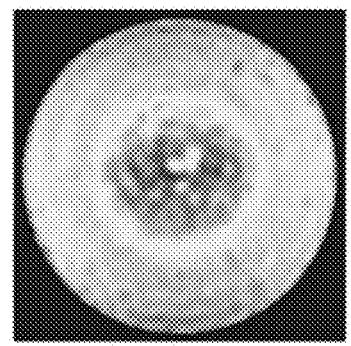
FIGS. 10A to 10C are diagrams obtained by inversely transforming the selected regions of FIGS. 9A to 9C, respectively.
Figure 10B:
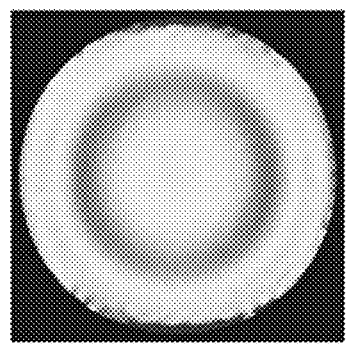
Figure 10B:
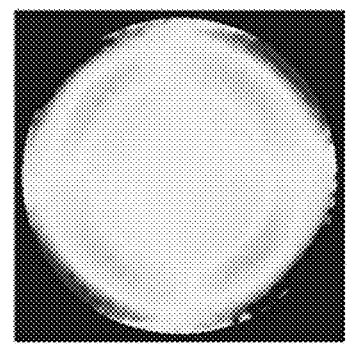
Figure 10C:
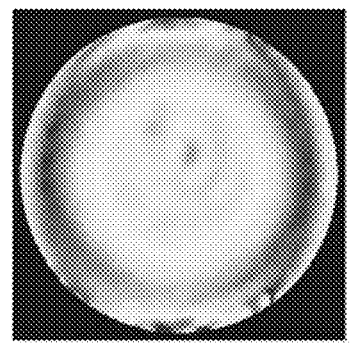
Figure 10C:
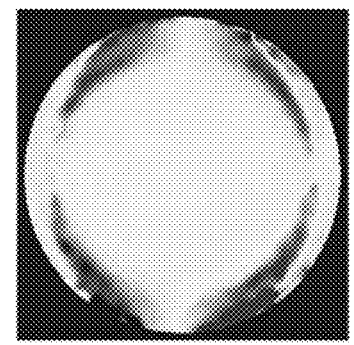
Figure 11A:
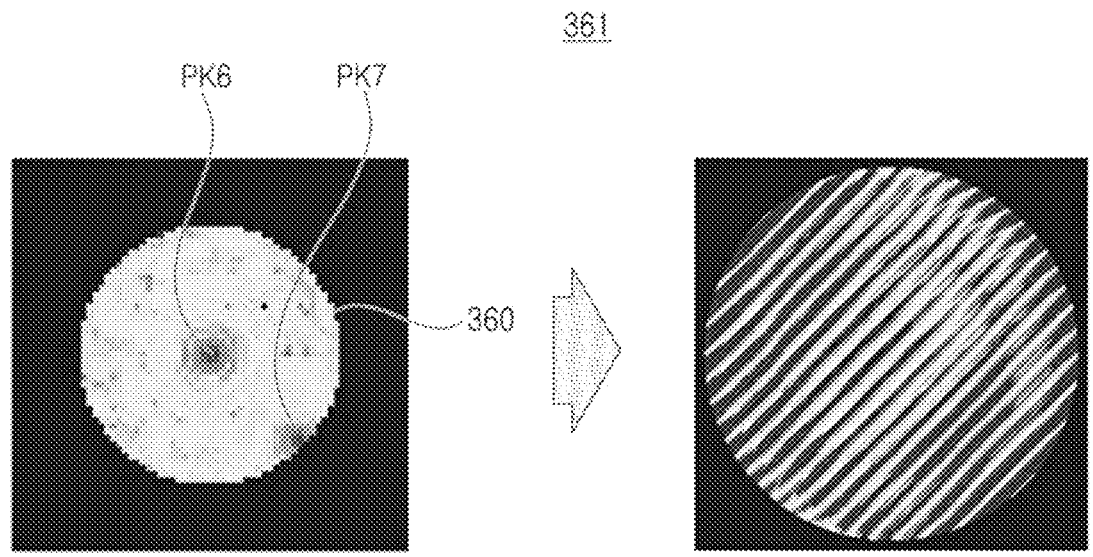
FIGS. 11A to 11C are diagrams illustrating a process of correcting a selected region from FIG. 8.
Figure 11B:
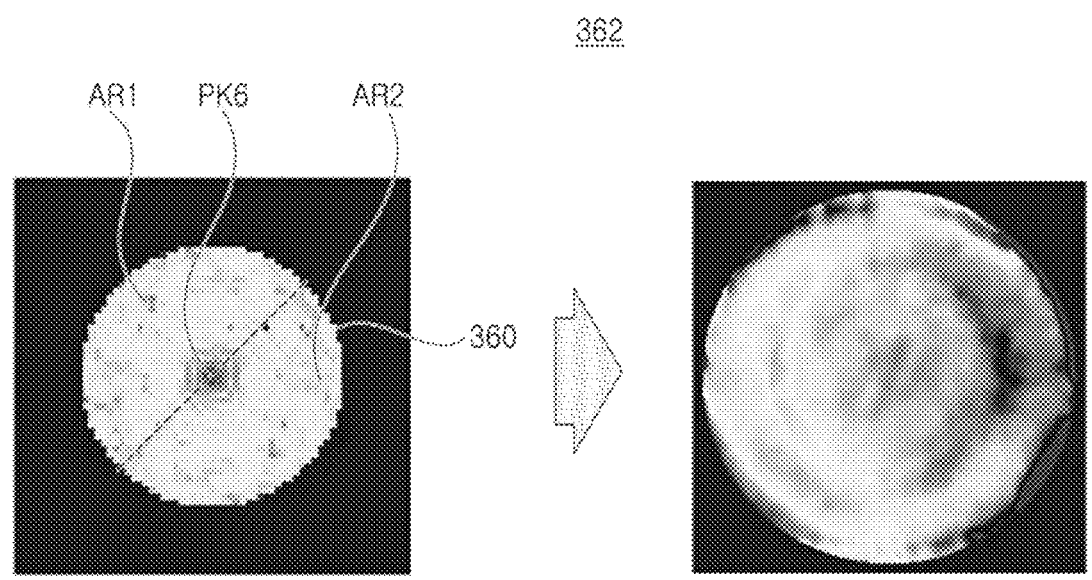
Figure 11C:
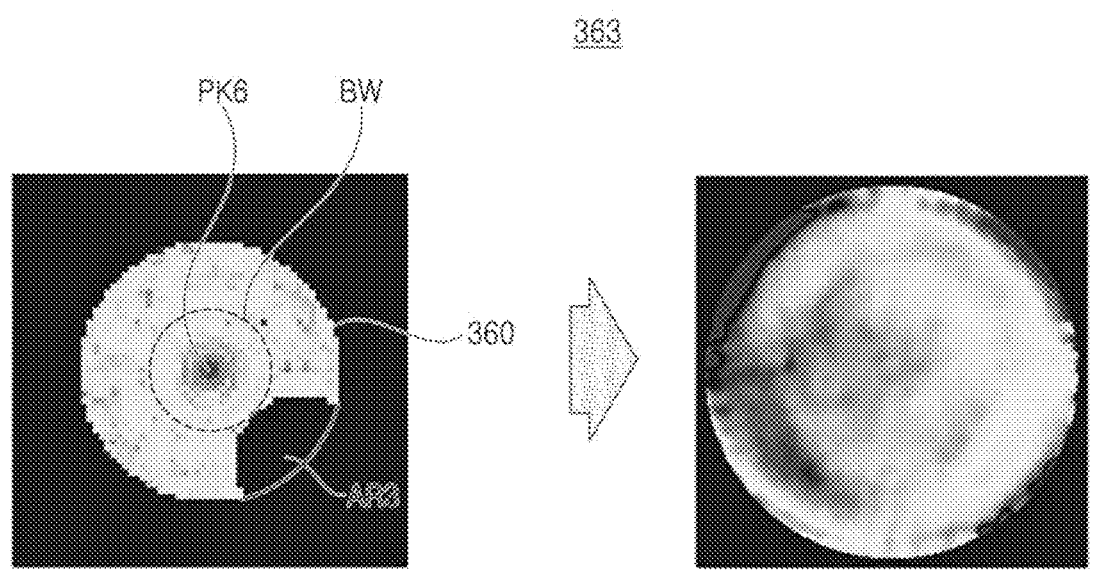

FIG. 6 is a diagram illustrating a measurement image obtained by a semiconductor measurement apparatus according to an example embodiment. FIG. 7A is an enlarged view of part A of FIG. 6, and FIGS. 7B and 7C are diagrams of a comparative example. FIG. 8 is a diagram illustrating an image obtained by transforming the measurement image of FIG. 6 into a frequency space, and FIG. 9 is an enlarged view of a region selected among regions in which a peak appears in FIG. 8. FIGS. 10A to 10C are diagrams obtained by inversely transforming the selected regions of FIGS. 9A to 9C, respectively, and FIGS. 11A to 11C are diagrams illustrating a process of correcting a selected region.

A measurement image 200 according to an example embodiment illustrated in FIG. 6 may be an image obtained by the image sensor 40, included in the semiconductor measurement apparatus 1, through a single image capture. The measurement image 200 may be represented in a first direction D1 and a second direction D2 defining a back focal plane. Coordinates of each of pixels, included in the measurement image 200, may be determined by an azimuthal angle and an incidence angle.

In an example embodiment corresponding to a case in which the illumination light L includes the first and second wavelengths λ1 and λ2, and in which the first and second wavelengths λ1 and λ2 have a wavelength of 450 nm and a wavelength of 650 nm, respectively, will be described as an example. The wavelengths λ1 and λ2, included in the illumination light L, may be incident on the surface of the sample 60 as linearly polarized light. Thus, the reflection light R, reflected from the sample 60, may also include linearly polarized light beams, having the first and second wavelengths λ1 and λ2, in the same manner. The linearly polarized light beams, included in the reflection light R, may be self-interfered by the self-interference generator 30, respectively. Thus, the measurement image 200 may include all interference patterns for each wavelength of the reflection light R reflected after being irradiated to a sample.

Referring to FIG. 7A, it can be seen that four interference patterns P1, P2, P3, and P4 in the measurement image 200 are repeated with a predetermined period between them. FIG. 7B illustrates a measurement image when irradiation light includes only the first wavelength 1. FIG. 7B shows two interference patterns P5 and P6 that are repeated with a predetermined period between them. FIG. 7C illustrates a measurement image when irradiation light includes only the second wavelength λ2. FIG. 7C shows two interference patterns P7 and P8 that are repeated with a predetermined period between them.

In other words, in the measurement image 200 of FIG. 7A, a periodic pattern may appear due to a wavelength difference between the first wavelength λ1 of FIG. 7B and the second wavelength λ2 of FIG. 7C. In this case, when the wavelength difference between the first and second wavelengths λ1 and λ2 included in the illumination light L is excessively small, an image having no periodicity may appear in the interference pattern appearing in the measurement image 200. Accordingly, it may be necessary to select the first and second wavelengths λ1 and λ2 of the illumination light L such that the interference pattern appears in the measurement image 200.

The controller 50 may transform the measurement image 200 into data in a two-dimensional frequency space and may select a region in which a peak, caused by self-interference, appears. FIG. 8 illustrates a two-dimensional image 300 obtained by transforming the measurement image 200 and including interference patterns of the first and second wavelengths λ1 and λ2, into data in a frequency space. In FIG. 8, it can be seen that five peaks PK1, PK2, PK3, PK4, and PK5 appear. The number of peaks, appearing in the data in the frequency space, may be related to the number of wavelengths included in the illumination light L. When the measurement image 200 is transformed into the data in the frequency space, the measurement image 200 may be represented as a sum of a constant term and an interference term.

A first peak PK1, disposed in a central portion of the two-dimensional image 300, may correspond to the constant term. A second peak PK2 and a third peak PK3 may correspond to the interference term. In addition, a fourth peak PK4 and a fifth peak PK5 may correspond to conjugates of the second peak PK2 and the third peak PK3, respectively. In other words, when N wavelengths are included in the illumination light L, it can be seen that the data in the frequency space may include one peak corresponding to the constant term and 2N peaks corresponding to the interference terms. The controller 50 may mark regions including a peak, and may select some regions from among the marked regions. In other words, the controller 50 may mark first to fifth regions 310, 320, 330, 340, and 350 in which the first to fifth peaks PK1, PK2, PK3, PK4 and PK5 appear, and may select some regions. In an example embodiment, a case in which the controller 50 selects a first region 310, a second region 320, and a third region 320 will be described by way of example. FIGS. 9A to 9C are diagrams illustrating the first region 310, the second region 320, and the third region 320 selected by the controller 50.

The controller 50 may inversely transform data included in each of the selected regions to divide the data into two-dimensional images. The two-dimensional images may include a first image and a second image. The first image may be an image representing an intensity of a polarization component of the reflection light R, and the second image may be an image representing a phase difference of the polarization component of the reflection light R. FIG. 10A illustrates a two-dimensional image obtained by inversely transforming data in the first region 310, which may be divided into only a first image 311. FIG. 10B illustrates a two-dimensional image obtained by inversely transforming data in the second region 320, which may be divided into a first image 321 and a second image 322. FIG. 10C illustrates a two-dimensional image obtained by inversely transforming data in the third region 330, which may be divided into a first image 331 and a second image 332.

In some example embodiments, the controller 50 may perform a process of determining the number of peaks included in each of the selected regions before data included in the selected regions is inversely transformed, and correcting an abnormal region including a plurality of peaks among the selected regions. A process in which the controller 50 corrects the abnormal region will be described with reference to FIGS. 11A to 11C. FIG. 11A illustrates an abnormal region 360 including two peaks PK6 and PK7. When the abnormal region 360 is inversely transformed to be divided into a two-dimensional image, it can be seen that the inversely transformed image is distorted.

FIGS. 11B and 11C are diagrams illustrating corrections performed by removing a peak PK6 disposed outside the abnormal region 360 of FIG. 11A. According to an example embodiment, a case in which a peak PK7 disposed relatively far from a central portion of the abnormal region 360 is removed (see FIG. 11A) is described as an example, but example embodiments are not limited thereto. A peak disposed close to the central portion of the abnormal region 360 may be defined and described as a first peak PK6, and a peak disposed relatively far away therefrom may be defined and described as a second peak PK7. The controller 50 may correct the abnormal region 360 by replacing a region including the second peak PK7 with other data or by deleting the region including the second peak PK7.

Referring to FIGS. 11A and 11B, the controller 50 may perform a correction of replacing data in a second region AR2, including the second peak PK7, among the selected regions 360 with data in a first region AR1 not including the second peak PK7.

In the alternative, referring to FIG. 11C, the controller 50 may perform a correction of deleting a third region AR3, including the second peak PK1, among the selected regions 360. In this case, the third region AR3 may be a region not overlapping a bandwidth BW of a peak PK6. FIG. 11C shows that each of the images in which the abnormal region is corrected is normally inversely transformed into a two-dimensional image.

The controller 50 may calculate, from a first image and a second image obtained for each wavelength, a first parameter $\Psi$ and a second parameter $\Delta$ necessary for determining critical dimensions of structures included in a sample. In an example embodiment, first and second wavelengths $\lambda 1$ and $\lambda 2$ may be included in a measurement image 200. Thus, a first parameter $\Psi 1$ and a second parameter 41, corresponding to the first wavelength $\lambda 1$, and a first parameter $\Psi 2$ and a second parameter 42, corresponding to the second wavelength $\lambda 2$, may be calculated. Accordingly, the semiconductor measurement apparatus 1 according to an example embodiment may use the measurement image 200 to obtain the first parameter $\Psi$ and the second parameter necessary for determining the critical dimensions of structures included in the sample through ellipsometry, for each wavelength.

Next, a method of operating the semiconductor measurement apparatus 1 of FIG. 1 will be described with reference to FIGS. 5, 6, 7A to 7C, 8, 9A to 9C, 10A to 10C, and 11A to 11C. In order to prevent repeated descriptions, a detailed description will be omitted with respect to features described in relation to the semiconductor measurement apparatus 1 of FIG. 1.

Figure 5:
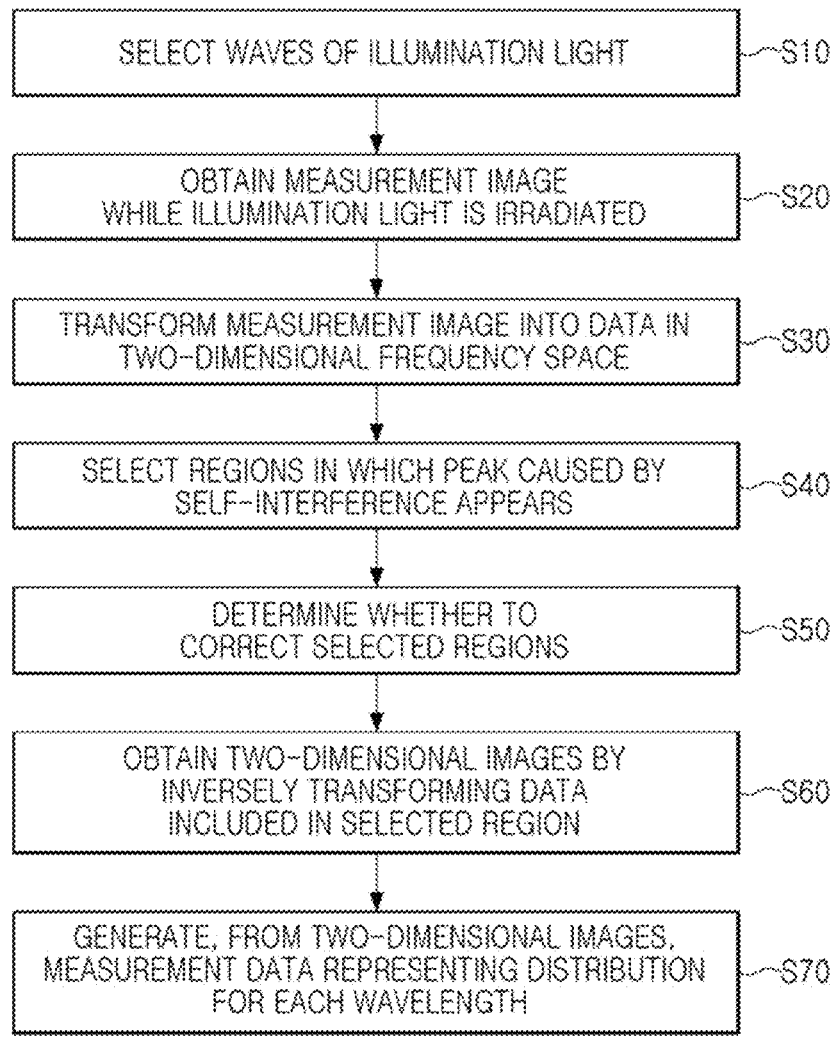
FIG. 5 is a flowchart illustrating a method of operating a semiconductor measurement apparatus according to an example embodiment.

Referring to FIGS. 5 and 1, the operation of the semiconductor measurement apparatus according to an example embodiment may be started by selecting wavelengths of illumination light L (S10). The controller 50 may control the wavelength selector 12 to select at least two different wavelengths of light output from the light source 11.

In some example embodiments, the controller 50 may, based on a pre-stored database, select light having at least two wavelengths with highest sensitivity with respect to a critical dimension of the sample 60, and may control the wavelength selector 12 to select light having the selected wavelengths and output the light as the illumination light L. The controller 50 may select a wavelength according to a structural property of a structure included in the sample 60 and a critical dimension of the structure to be measured. For example, a wavelength that has a relatively higher sensitivity than those of other wavelength bands may exist according to an extension direction of the structure, a shape of the structure, an approximate size of the structure, and/or the like. Accordingly, the controller 50 may determine a selection wavelength according to the structural property of the structure included in the sample 60 and/or the critical dimension of the structure to be measured.

The controller 50 may obtain a measurement image while the illumination light L is irradiated onto the sample 60 (S20). The controller 50 may transform the measurement image into data in a two-dimensional frequency space (S30). A Fourier transform, a Hilbert transform, and/or the like may be applied to a transform. The controller 50 may select a region of the data in the two-dimensional frequency space in which a signal according to interference (i.e., a peak caused by self-interference) appears (S40). For example, data included in the region selected in operation S40 may be data corresponding to an image formed on a back focal plane defined at a pupil position of an objective lens included in an optical unit of a semiconductor measurement apparatus. Accordingly, the controller may inversely transform the data included in the region selected in operation S30 to obtain a two-dimensional image formed on the back focal plane of the objective lens 22. For example, the Fourier transform and/or the Hilbert transform may be applied to the transform and the inverse transform of operations S30 and S60.

The controller 50 may determine whether to correct regions selected in operation S40 and may correct the selected regions when it is necessary to correct the selected regions. The controller 50 may obtain two-dimensional data by inversely transforming data included in the selected regions (S60), and may generate, from two-dimensional images, measurement data representing a distribution for each wavelength (S70).

Figure 12:
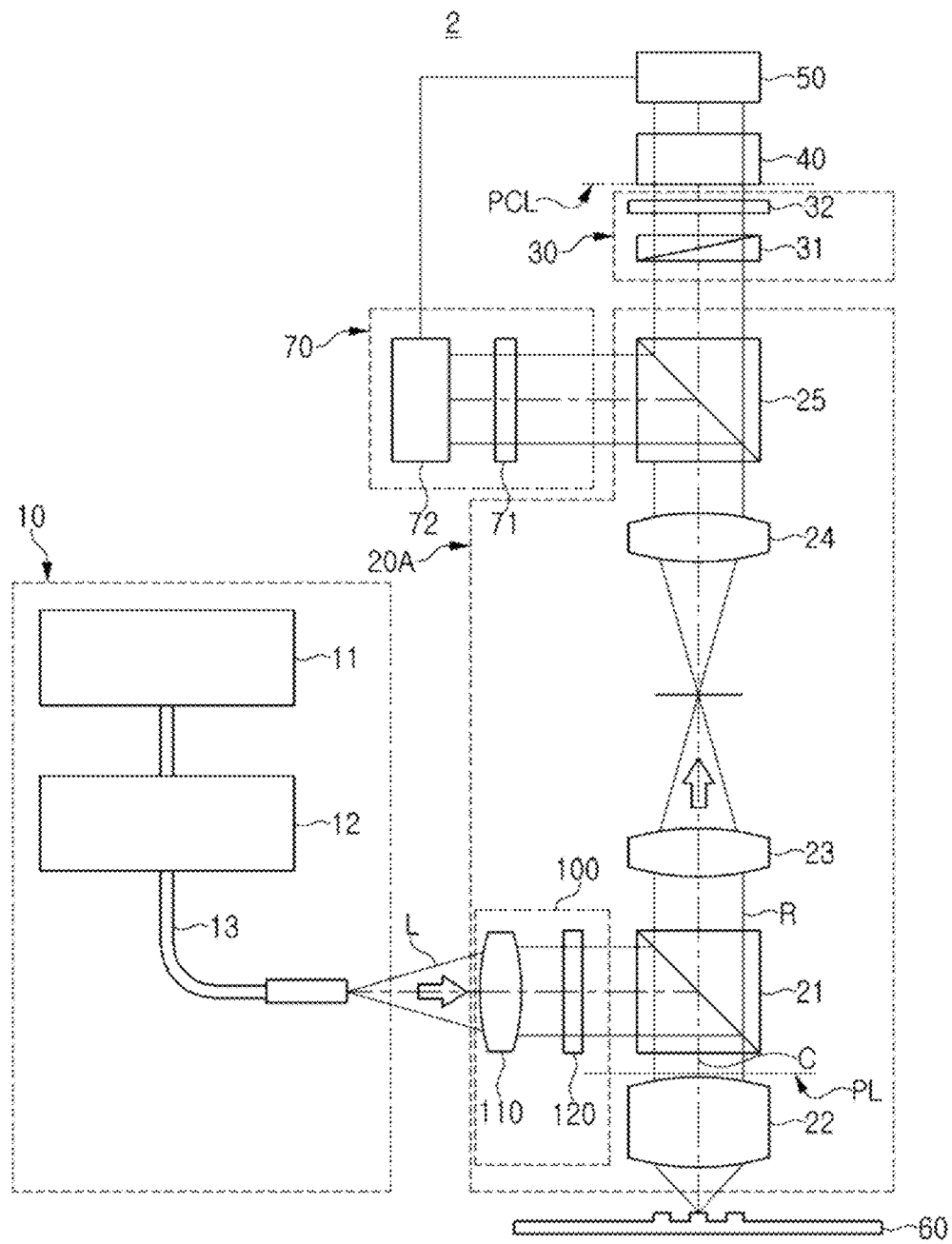
FIGS. 12 to 18 are diagrams illustrating various example embodiments of a semiconductor measurement apparatus.

A semiconductor measurement apparatus according to an example embodiment will be described with reference to FIG. 12. FIG. 12 is a schematic diagram illustrating a semiconductor measurement apparatus according to an example embodiment.

Referring to FIG. 12, a semiconductor measurement apparatus 2 according to an example embodiment may include an illumination unit 10, an optical unit 20A, a self-interference generator 30, a first image sensor 40, a controller 50, and a sensor unit 70. The semiconductor measurement apparatus 2 according to this example embodiment is different from the semiconductor measurement apparatus 1 of FIG. 1 described above, in terms of features of the optical unit 20A and the sensor unit 70. Thus, the semiconductor measurement apparatus 2 will be described based on these different features, and detailed descriptions of other features will be omitted.

The first image sensor 40 of the semiconductor measurement apparatus 2 may have a feature the same as that of the image sensor 40 of the semiconductor measurement apparatus 1 of FIG. 1. For example, the controller 50 may calculate the critical dimension of the sample 60 using a first measurement image generated by the first image sensor 40.

The optical unit 20A may further include a second beam splitter 25 for allowing the reflection light R reflected from the sample 60 to be incident on each of the self-interference generator 30 and the sensor 40.

The sensor unit 70 may include a polarization element 71 and a second image sensor 72. The polarization element 71 may polarize light refracted by the second beam splitter 25 to transmit the polarized light to the second image sensor 72. The second image sensor 72 may generate a second measurement image. The controller 50 may verify, based on the second measurement image transmitted from the second image sensor 72, a target region of the sample 60, and may focus on the target region.

Figure 13:
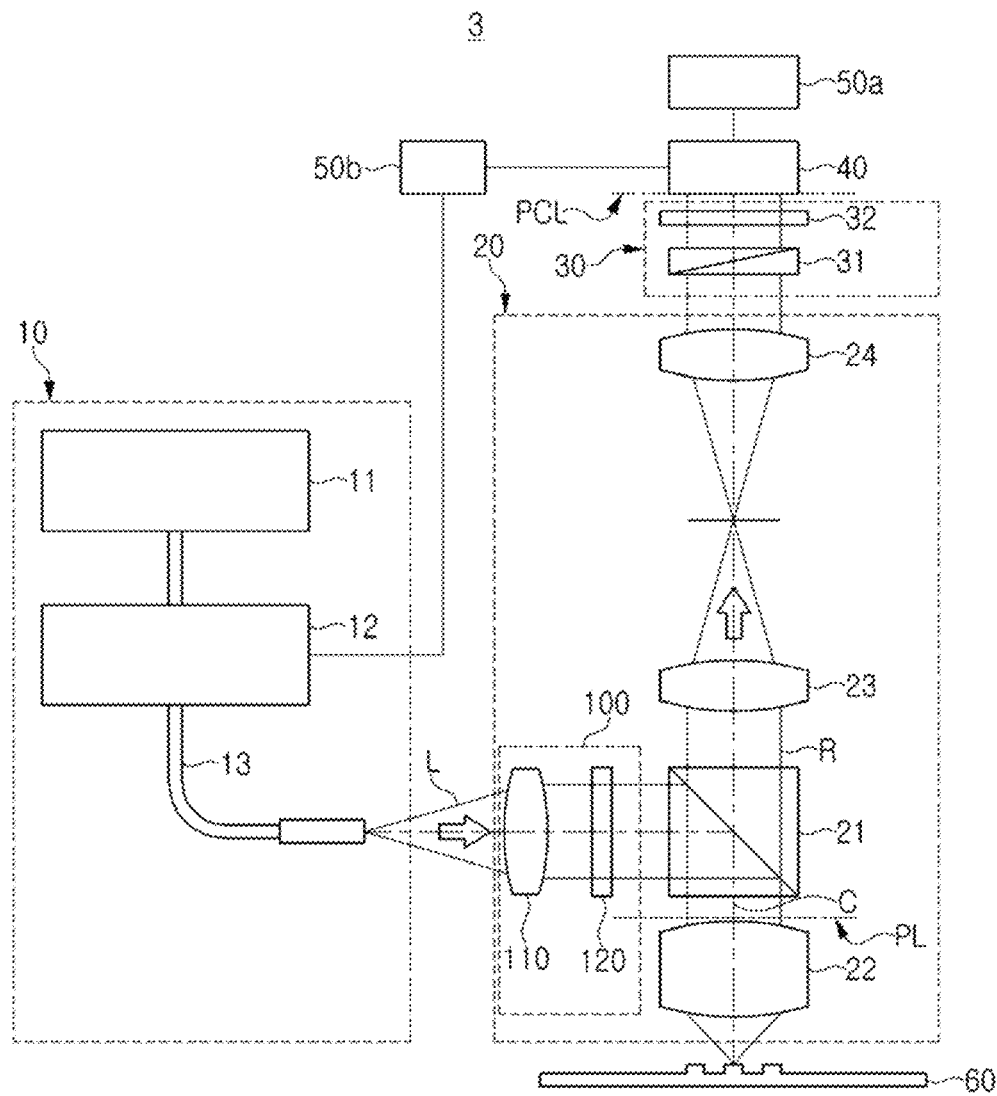

FIG. 13 is a schematic diagram illustrating a semiconductor measurement apparatus according to an example embodiment. Referring to FIG. 13, a semiconductor measurement apparatus 3 according to an example embodiment may include an illumination unit 10, an optical unit 20, a self-interference generator 30, an image sensor 40, a first controller 50a, and a second controller 50b. The semiconductor measurement apparatus 3 according to this example embodiment is different from the semiconductor measurement apparatus 1 of FIG. 1 described above in that the second controller 50b is further included. The semiconductor measurement apparatus 3 will be described based on this different feature, and detailed descriptions of other features will be omitted.

The first controller 50a of the semiconductor measurement apparatus 3 may be the same as the controller 50 of the semiconductor measurement apparatus 1 of FIG. 1, in terms of its operation. In addition, in some example embodiments, the first controller 50a and the second controller 50b may be integrated with each other.

The second controller 50b may be connected to the image sensor 40 and the wavelength selector 12 to review periodicity and contrast of interference patterns included in a measurement image transmitted from the image sensor 40 and may determine whether to divide the measurement image into a first image and a second image for each wavelength. When the periodicity of the interference pattern is not verifiable or the contrast of the interference pattern does not satisfy a reference value, the second controller 50b may determine that the measurement image cannot be divided into the first image and the second image for each wavelength. In this case, the second controller 50b may repeatedly perform a feedback process of changing wavelengths selected by the wavelength selector 12 or adjusting an amount of light of each of the wavelengths by controlling the wavelength selector 12 until the measurement image transmitted from the image sensor 40 is divided into the first image and the second image for each wavelength.

Figure 14:
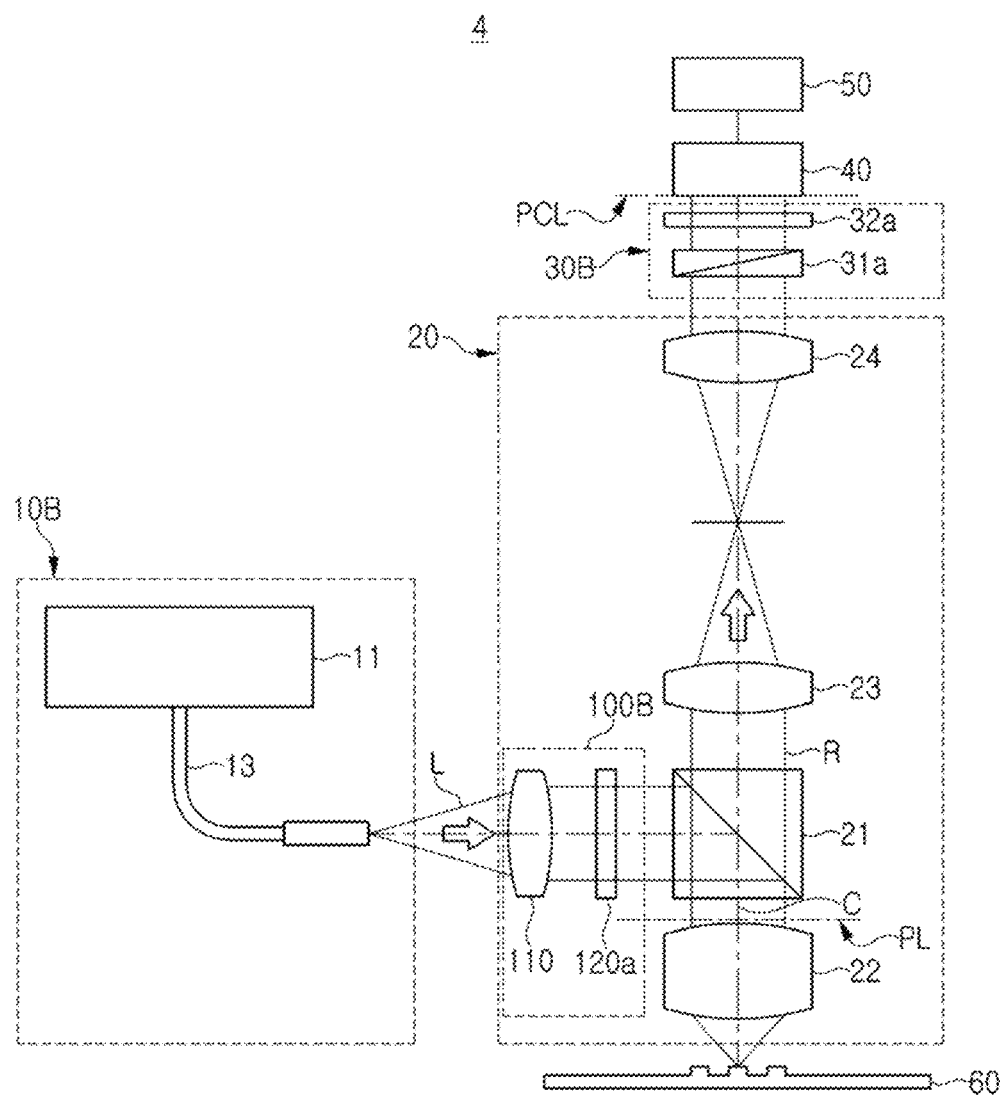
Figure 15:
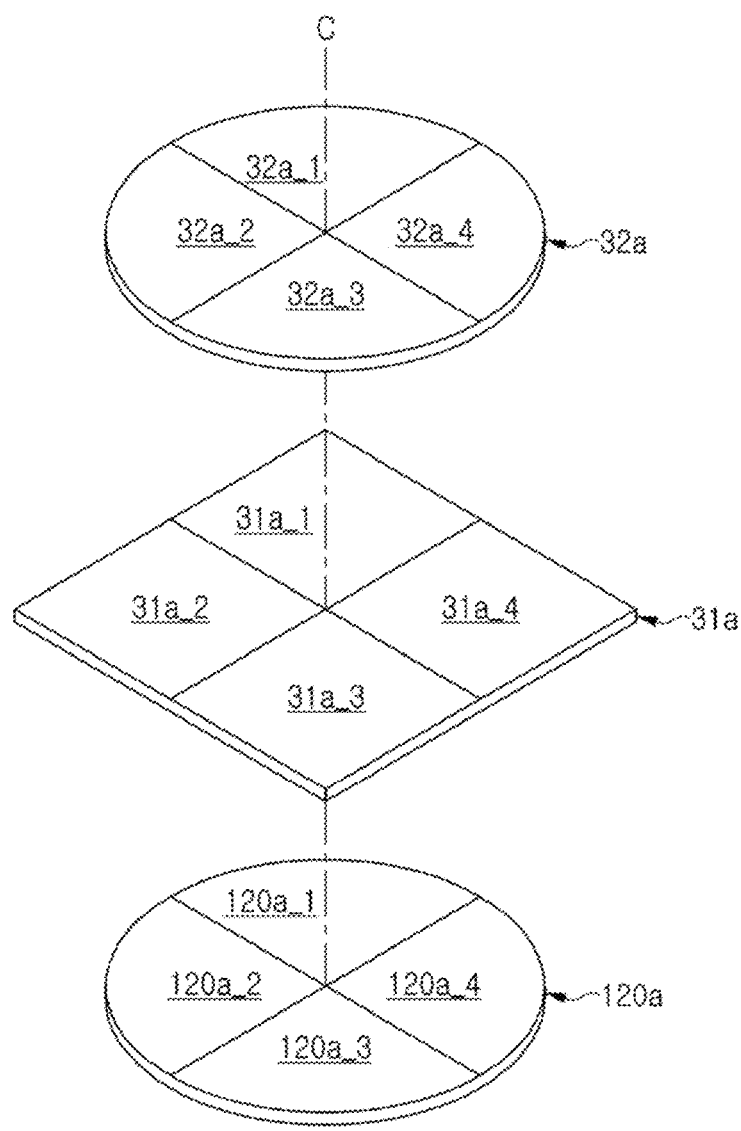

FIG. 14 is a schematic diagram illustrating a semiconductor measurement apparatus according to an example embodiment. FIG. 15 is a diagram illustrating a measurement method performed by the semiconductor measurement apparatus of FIG. 14.

Referring to FIG. 14, a semiconductor measurement apparatus 4 according to an example embodiment may include an illumination unit 10B, an optical unit 20, a self-interference generator 30B, a first image sensor 40, and a controller 50. The semiconductor measurement apparatus 4 according to this example embodiment is different from the semiconductor measurement apparatus of FIG. 1 described above, in terms of features of the illumination unit 10B, the self-interference generator 30B, and the polarization generator 100B. Thus, the semiconductor measurement apparatus 4 will be described based on these different features, and detailed descriptions of other features will be omitted.

Referring to FIGS. 14 and 15, the light source 11 in the illumination unit 10B may output light having specific wavelengths according to an example embodiment. Accordingly, the wavelength selector according to the example embodiment described above is omitted.

According to an example embodiment, each of a polarizer 120a (in the polarization generator 100B) and a prism member 31a and polarization element 32a (in the self-interface generator 30B) may be divided into four parts based on an optical axis C. In an example embodiment, a case in which each of the polarizer 120a, the prism member 31a, and the polarization element 32a is divided into four parts is described as an example. However, example embodiments are not limited to such an embodiment. For example, each of the polarizer 120a, the prism member 31a, and the polarization element 32a may be divided into eight parts or any other suitable number of parts.

The polarizer 120a may include four divided pieces 120a_1, 120a_2, 120a_3, and 120a_4, each having a fan shape. Each of the divided pieces 120a_1, 120a_2, 120a_3, and 120a_4 may have an interference direction in which the divided pieces 120a_1, 120a_2, 120a_3, and 120a_4 have a difference between themselves corresponding to 90 degrees. Accordingly, compared to the example embodiment described above, the semiconductor measurement apparatus 4 according to an example embodiment may be advantageous in that it is possible to obtain reflection light, interfered in each of the divided pieces, through a single image capture.

Similarly, the prism member 31a may include four divided pieces 31a_1, 31a_2, 31a_3, and 31a_4, each having a square shape, and the polarization member 32a may include four divided pieces 32a_1, 32a_2, 32a_3, and 32a_4, each having a fan shape.

Figure 16:
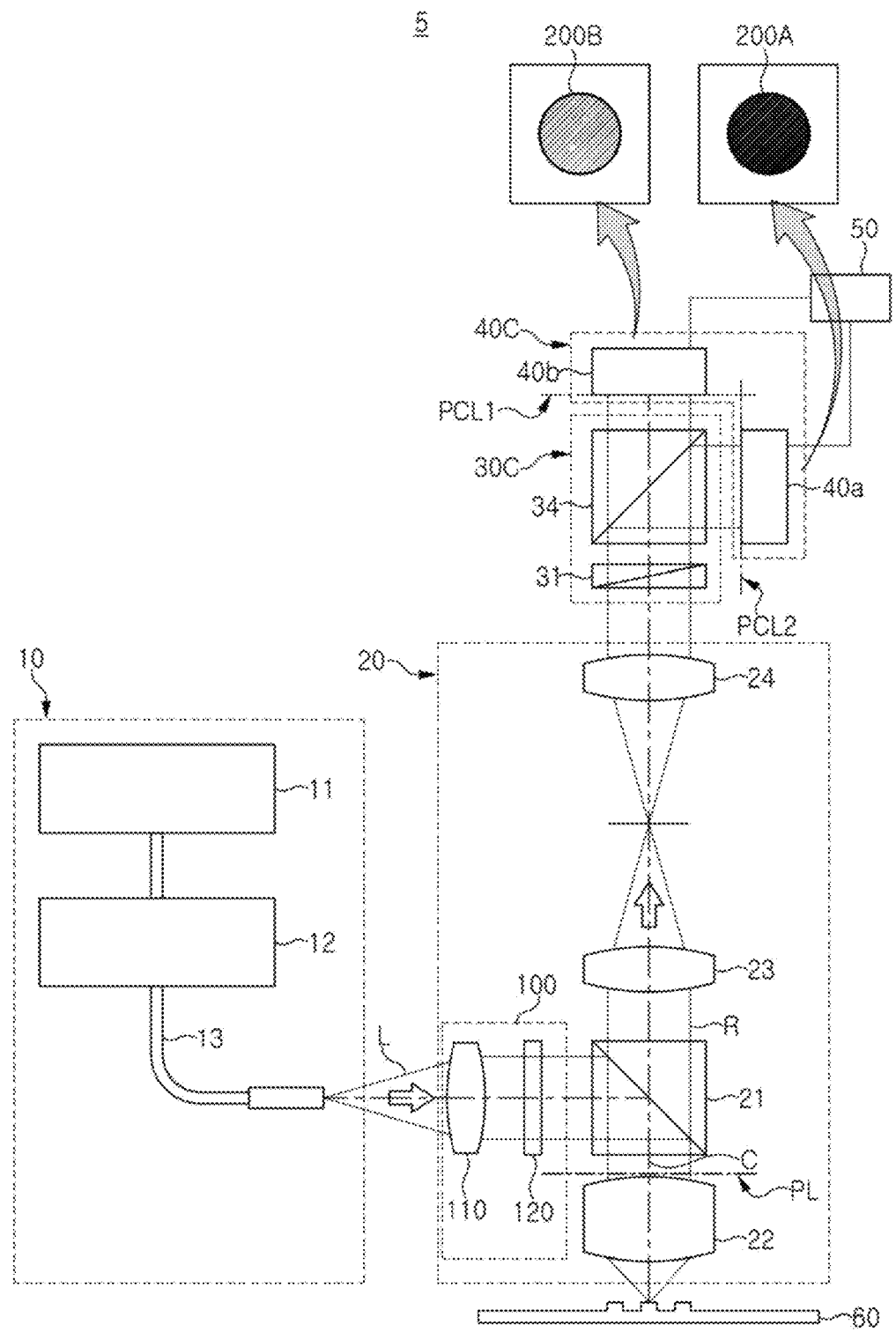

FIG. 16 is a schematic diagram illustrating a semiconductor measurement apparatus according to an example embodiment. Referring to FIG. 16, a semiconductor measurement apparatus 5 according to an example embodiment may include an illumination unit 10, an optical unit 20, a self-interference generator 30C, an image sensor unit 40C, and a controller 50. The semiconductor measurement apparatus 5 according to an example embodiment is different from the semiconductor measurement apparatus 1 of FIG. 1 described above in that the image sensor unit 40C includes two image sensors 40a and 40b and the self-interference generator 30C includes a polarization beam splitter 34. Thus, the semiconductor measurement apparatus 5 will be described based on these different features, and detailed descriptions of other features will be omitted.

The image sensor unit 40C may include a first image sensor 40a and a second image sensor 40b. The first image sensor 40a and the second image sensor 40b may output a first measurement image 200A and a second measurement image 200B, respectively. The controller 50 may obtain the first measurement image 200A and the second measurement image 200B from the first image sensor 40a and the second image sensor 40b, respectively.

The self-interference generator 30C may include the prism member 31 and a polarization beam splitter 34. The polarization beam splitter 34 may be configured to reflect linearly polarized light beams, polarized by 45 degrees, and transmit linearly polarized light beams, polarized by 135 degrees. Accordingly, the polarization beam splitter 34 may provide linearly polarized light beams, having different polarization directions, to the first image sensor 40a and the second image sensor 40b, respectively.

The first image sensor 40a may detect an interference pattern of each polarization component reflected by the polarization beam splitter 34. The second image sensor 40b may detect an interference pattern of each polarization component transmitted through the polarization beam splitter 34. Accordingly, the first measurement image 200A and the second measurement image 200B respectively output from the first image sensor 40a and the second image sensor 40b may include interference patterns having phases inverted from each other.

In the semiconductor measurement apparatus 1 according to the example embodiment described above with respect to FIG. 1, when intensity of one of two linearly polarized light beams divided by the prism member 31 is lowered, contrast of a measurement image obtained from an image sensor may be lowered. However, in this example embodiment, it may not be possible to determine a linearly polarized light having lowered intensity. However, the semiconductor measurement apparatus 5 according to an example embodiment with respect to FIG. 16 may have an advantage of being able to determine a linearly polarized light having lowered intensity.

Figure 17:
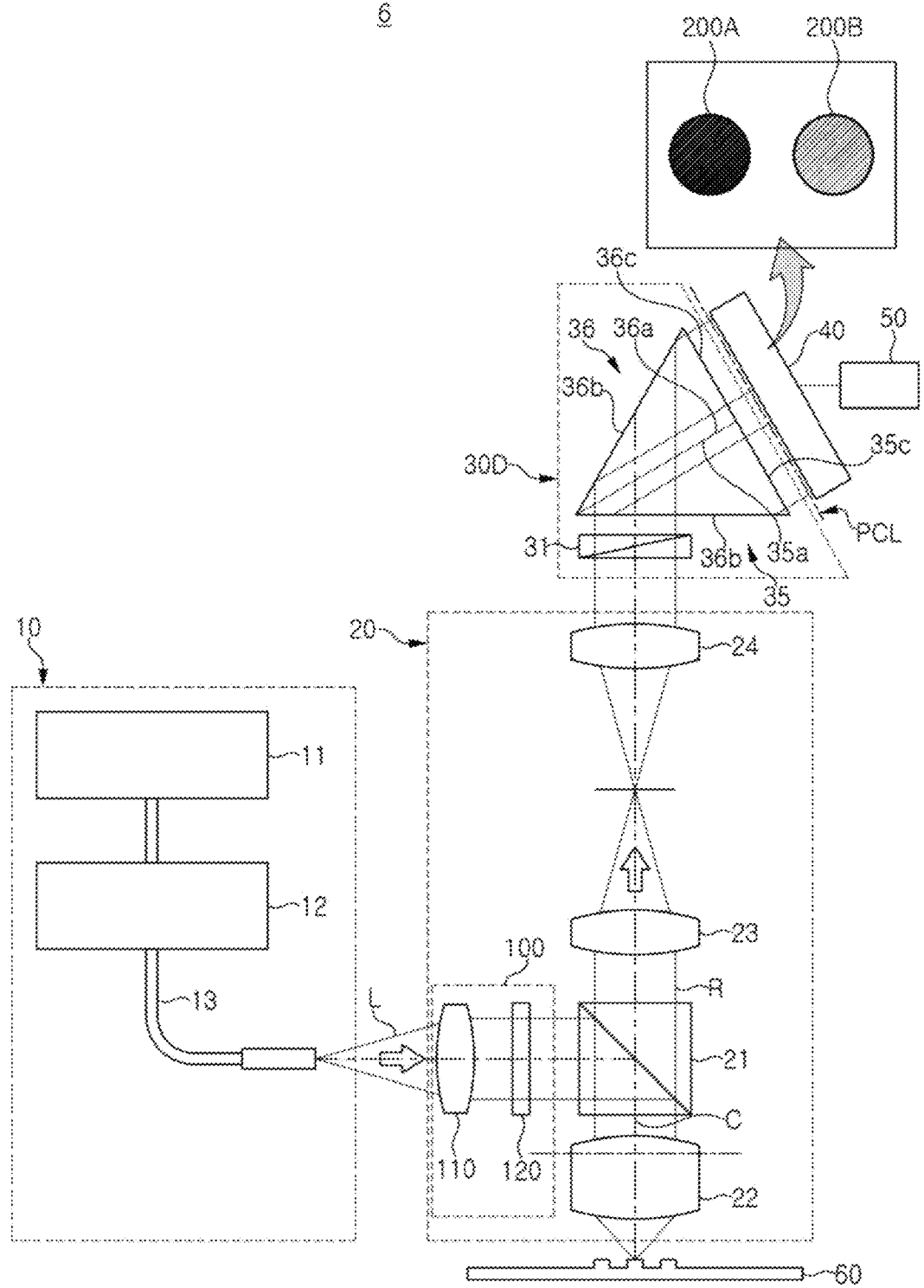

FIG. 17 is a schematic diagram illustrating a semiconductor measurement apparatus according to an example embodiment. Referring to FIG. 17, a semiconductor measurement apparatus 6 according to an example embodiment may include an illumination unit 10, an optical unit 20, a self-interference generator 30D, an image sensor 40, and a controller 50. The semiconductor measurement apparatus 6 according to this example embodiment is different from the semiconductor measurement apparatus 1 of FIG. 1 described above in that the self-interference generator 30D includes a polarization beam splitter in which two triangular prisms 35 and 36 are bonded to each other. The semiconductor measurement apparatus 6 will be described based on these different features, and detailed descriptions of other features will be omitted.

The self-interference generator 30D according to an example embodiment may include a polarization beam splitter in which a first triangular prism 35 and a second triangular prism 36 are bonded to each other. The first triangular prism 35 and the second triangular prism 36 may have a right-angled triangle as a base surface. The first triangular prism 35 may have two side surfaces 35a and 35c with a first right-angled edge therebetween, and a side surface 35b opposite the first right-angled edge. The second triangular prism 36 may have two side surfaces 36a and 36c with a second right-angled edge therebetween, and a side surface 36b opposite the second right-angled edge. The second triangular prism 36 may be disposed to be symmetrical with the first triangular prism 35 using the side surface 36a as an axis. A side surface 35a of the first triangular prism 35 and a side surface 36a of the second triangular prism 36 may be bonded to each other. The side surfaces 35a and 36a, operating as bonding surfaces, may be configured to reflect linearly polarized light beams, polarized by 45 degrees, and transmit linearly polarized light beams, polarized by 135 degrees, among linearly polarized light beams divided by the prism member 31. In other words, the polarization beam splitter made of the first and second triangular prisms 35, 36 may output, to a back focal plane of an image sensor 40, each reflected component and each transmitted component. Accordingly, in the semiconductor measurement apparatus 6 according to an example embodiment, an image sensor 40 may have an advantage of being able to determine linearly polarized light having lowered intensity among linearly polarized light beams passing through the polarization beam splitter.

Figure 18:
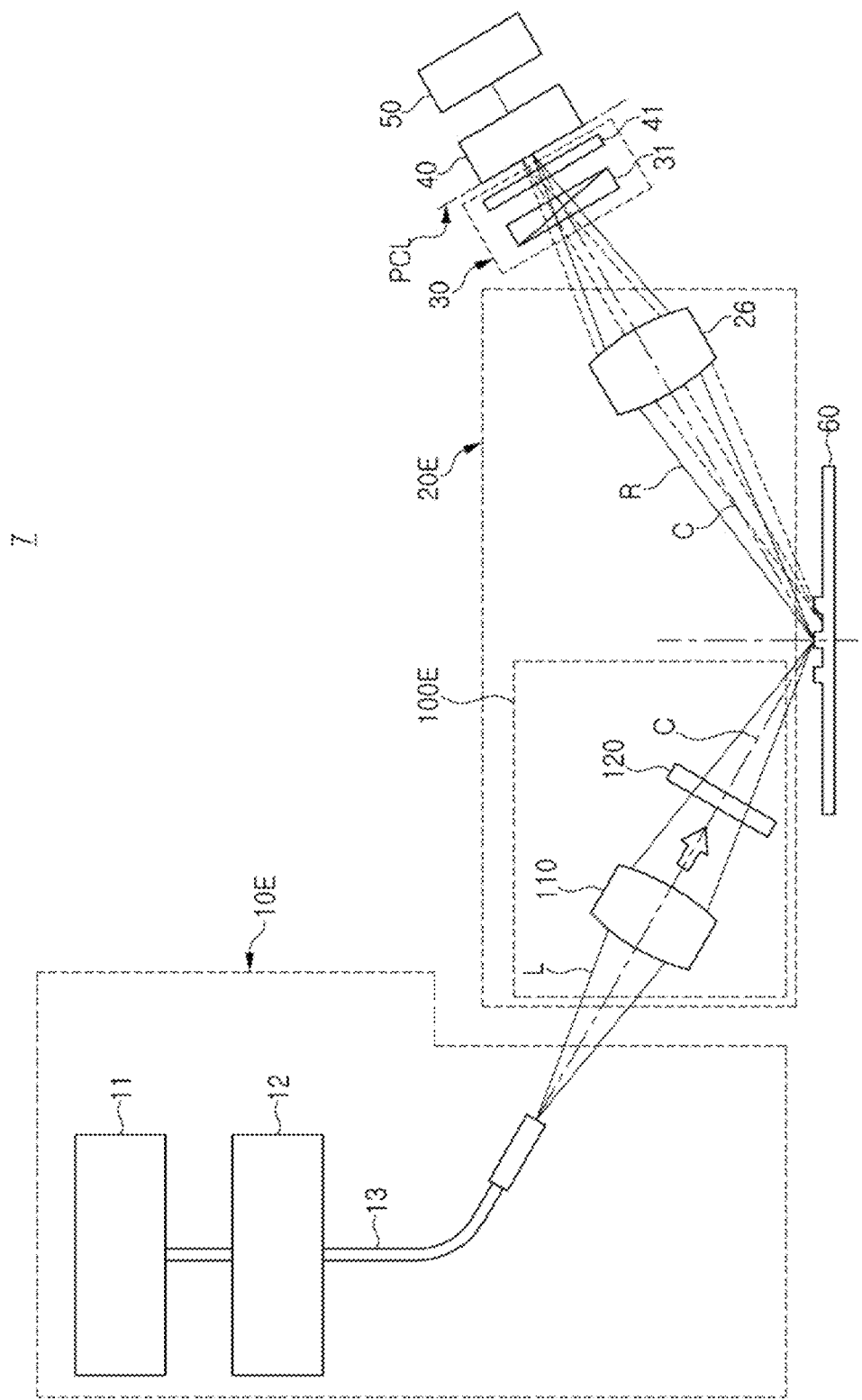

FIG. 18 is a schematic diagram illustrating a semiconductor measurement apparatus according to an example embodiment. Referring to FIG. 18, a semiconductor measurement apparatus 7 according to an example embodiment may include an illumination unit 10E, an optical unit 20E, a self-interference generator 30, an image sensor 40, and a controller 50. The optical unit 20E may include a polarization generator 100E and a condensing lens 26. The polarization generator 100E may include an illumination lens 110 and a polarizer 120. The semiconductor measurement apparatus 7 according to an example embodiment is different from the semiconductor measurement apparatus 1 of FIG. 1 described above in that the illumination unit 10E, the polarization generator 100E in the optical unit 20E, the condensing lens 26 in the optical unit 20E and the self-interference generator 30 are disposed to be inclined with respect to the sample 60, and the optical unit 20E does not include the beam splitter 21. Thus, the semiconductor measurement apparatus 7 will be described based on these different features, and detailed descriptions of other features will be omitted.

The illumination unit 10E may illuminate the sample 60 with illumination light L including linearly polarized light that passes through the polarization generator 100E. The optical axis C of the illumination light L incident on the sample 60 may be inclined with respect to the sample 60. Compared to the semiconductor measurement apparatus 1 of FIG. 1 described above, the illumination unit 10E according to an example embodiment may not include an objective lens.

The condensing lens 26 in the optical unit 20E may transmit the reflection light R generated when the illumination light L is reflected from the sample 60 to output the reflection light R to the self-interference generator 30. The optical axis C of the reflection light R may be inclined with respect to a measurement surface of the sample 60. The image sensor 40 may be disposed on a back focal plane of the condensing lens 26.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor measurement apparatus comprising:
an illumination unit configured to select light having different wavelengths and provide the light as illumination light;
an optical unit including a polarization generator configured to select a polarization state of the illumination light, an objective lens configured to allow the illumination light to be incident on a sample, and a beam splitter configured to transmit reflection light generated when the illumination light is reflected from the sample;
a self-interference generator configured to self-interfere and transmit the reflection light transmitted from the beam splitter, for each wavelength;
an image sensor configured to output a measurement image including an interference pattern of the reflection light on a back focal plane of the objective lens; and
a controller configured to process the measurement image to determine a critical dimension of a structure included in a region of the sample on which the illumination light is incident,
wherein the controller is configured to find regions of a plurality of interference components caused by self-interference corresponding to a wavelength selected by the illumination unit by transforming the measurement image into data in a two-dimensional frequency space, to obtain two-dimensional images divided for each wavelength on the back focal plane by inversely transforming data included in each of the regions of the plurality of interference components, and to determine critical dimensions of the structure using the two-dimensional images.

2. The semiconductor measurement apparatus as claimed in claim 1, wherein the controller is configured to inversely transform the data included in each of the regions of the plurality of interference components to divide the data into a first image representing an intensity ratio of a polarization component of the reflection light and a second image representing a phase difference of the polarization component of the reflection light, for each wavelength.

3. The semiconductor measurement apparatus as claimed in claim 2,
wherein the first image and the second image include pixels, and each of the pixels includes a first component corresponding to a distance from an optical axis of light, and a second component corresponding to an angle from a reference axis parallel to a surface of the sample; and
wherein the first component is determined by an incidence angle of the illumination light incident on the objective lens, and the second component is determined by an azimuthal angle of the illumination light incident on the objective lens.

4. The semiconductor measurement apparatus as claimed in claim 1, wherein the self-interference generator includes a prism member and a polarization element.

5. The semiconductor measurement apparatus as claimed in claim 4, wherein the prism member is at least one of a Nomarski prism, a Wollaston prism, and a Rochon prism.

6. The semiconductor measurement apparatus as claimed in claim 1, wherein the image sensor is configured to obtain the measurement image of the reflection light at an azimuthal angle between 0 degrees to 360 degrees, inclusive, through a single shutter operation.

7. The semiconductor measurement apparatus as claimed in claim 1, wherein the illumination unit includes:
a light source configured to emit light having a broadband wavelength; and
a wavelength selector configured to select and output light having different wavelengths from the light with the broadband wavelength emitted from the light source.

8. The semiconductor measurement apparatus as claimed in claim 7, wherein the controller is configured to control the wavelength selector to adjust an intensity of the light having the different wavelengths selected by the wavelength selector.

9. The semiconductor measurement apparatus as claimed in claim 8, wherein the controller is configured to:
analyze the measurement image in real time, and
change a wavelength or the intensity of the light having the different wavelengths selected by the wavelength selector until periodicity or contrast of the interference pattern satisfies a reference value.

10. The semiconductor measurement apparatus as claimed in claim 1, wherein the polarization generator is disposed between the illumination unit and the self-interference generator, and includes a polarizer configured to select the polarization state of the illumination light.

11. The semiconductor measurement apparatus as claimed in claim 1, wherein the controller is configured to:
identify a number of peaks of the plurality of interference components included in the regions of the plurality of inference components,
classify each of the regions of the plurality of interference components as one of a normal region including one peak and an abnormal region including two or more peaks, the two or more peaks including a first peak and a second peak, the first peak being closer to a central portion of the abnormal region than the second peak, and
remove the second peak of the abnormal region among the two or more peaks included in the abnormal region.

12. The semiconductor measurement apparatus as claimed in claim 11, wherein the controller is configured to replace data in the abnormal region including the second peak with data in the abnormal region not including the second peak.

13. The semiconductor measurement apparatus as claimed in claim 11, wherein the controller is configured to delete data in the abnormal region including the second peak.

14. The semiconductor measurement apparatus as claimed in claim 13, wherein a portion of the abnormal region including the second peak does not overlap a bandwidth of the first peak.

15. The semiconductor measurement apparatus as claimed in claim 1, wherein a surface of the image sensor is disposed at a conjugate position with respect to a position of the back focal plane.

16. A semiconductor measurement apparatus comprising:
an illumination unit configured to provide illumination light including light having different wavelengths;
an optical unit including a polarization generator configured to select a polarization state of the illumination light, and an objective lens configured to allow the illumination light to be incident on a sample, the optical unit being configured to transmit reflection light generated when the illumination light is reflected from the sample;
a self-interference generator configured to self-interfere the reflection light transmitted from the optical unit and transmit the reflection light to a first image sensor, for each wavelength; and
a controller configured to process a measurement image output by the first image sensor to divide the measurement image into a first image representing an intensity ratio of a polarization component of the reflection light and a second image representing a phase difference of the polarization component of the reflection light, for each wavelength.

17. The semiconductor measurement apparatus as claimed in claim 16, wherein the controller is configured to:
transform the measurement image into data in a two-dimensional frequency space,
find, in the data in the two-dimensional frequency space, regions including a plurality of interference components generated by the reflection light self-interfered for each wavelength,
inversely transform data included in each of the regions, and
divide the data into the first image and the second image for each wavelength.

18. The semiconductor measurement apparatus as claimed in claim 16, wherein the optical unit includes a first beam splitter disposed adjacent to the objective lens and on which the illumination light is incident, and a second beam splitter disposed adjacent to the self-interference generator and from which the reflection light is split.

19. The semiconductor measurement apparatus as claimed in claim 18, further comprising:
a second image sensor configured to image the reflection light split from the second beam splitter.

20. A semiconductor measurement apparatus comprising:
an image sensor configured to:
divide reflection light generated when illumination light including a polarization component having different wavelengths is reflected from a sample into first and second polarization components in a polarization direction that are orthogonal to each other or have an arbitrary predetermined angle, for each wavelength, and
output an interference pattern for self-interfering the first and second polarization components for each wavelength; and
a controller configured to:
find regions of a plurality of interference components caused by self-interference by transforming the interference pattern output by the image sensor into data in a two-dimensional frequency space,
obtain two-dimensional images divided for each wavelength by transforming data included in each of the regions, and obtain, from the two-dimensional images, a first image representing an intensity ratio of the polarization component of the reflection light reflected from the sample, and a second image representing a phase difference of the polarization component of the reflective light reflected from the sample, for each wavelength.

* * * * *